United States Patent
Chun et al.

(10) Patent No.: US 8,053,975 B2
(45) Date of Patent: Nov. 8, 2011

(54) ORGANIC LIGHT EMITTING DEVICE

(75) Inventors: Min-Seung Chun, Suwon-si (KR);
Kwan-Hee Lee, Suwon-si (KR);
Mi-Kyung Kim, Suwon-si (KR);
Dong-Hun Kim, Suwon-si (KR);
Jae-Hyun Kwak, Suwon-si (KR);
Jung-Ha Son, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 341 days.

(21) Appl. No.: 12/120,815

(22) Filed: May 15, 2008

(65) Prior Publication Data

US 2008/0284324 A1 Nov. 20, 2008

(30) Foreign Application Priority Data

May 16, 2007 (KR) .................. 10-2007-0047849

(51) Int. Cl.
*H01J 1/62* (2006.01)
*H01J 63/04* (2006.01)
(52) U.S. Cl. ...................... 313/504; 313/506
(58) Field of Classification Search ............ 313/504, 313/506
See application file for complete search history.

(56) References Cited

U.S. PATENT DOCUMENTS

| | | | |
|---|---|---|---|
| 4,356,429 A | 10/1982 | Tang | |
| 7,023,013 B2 * | 4/2006 | Ricks et al. | 257/40 |
| 7,345,300 B2 * | 3/2008 | Qin et al. | 257/40 |
| 7,400,088 B2 * | 7/2008 | Ryu | 313/504 |
| 2002/0034660 A1 * | 3/2002 | Burrows et al. | 428/690 |
| 2003/0197467 A1 * | 10/2003 | Adachi et al. | 313/504 |
| 2003/0209972 A1 | 11/2003 | Holmes et al. | |

(Continued)

FOREIGN PATENT DOCUMENTS

CN 1725921 A 1/2006
(Continued)

OTHER PUBLICATIONS

Chishio Hosokawa, et al., "Highly efficient blue electroluminescence from a distyrylarylene emitting layer with a new dopant," *Applied Physics Letters*, Dec. 25, 1995, pp. 3853-3855, vol. 67, No. 26, American Institute of Physics, Melville, New York. (XP000548843).
European Search Report dated Mar. 3, 2009, completed Feb. 25, 2009, for corresponding Application No. EP 08 15 6069, noting the references cited in this IDS.
Korean Patent Abstracts, Publication No. 1020050040960 A; Date of Publication: May 4, 2005; in the name of Dong Hyun Jung, et al.

(Continued)

*Primary Examiner* — Nimeshkumar D. Patel
*Assistant Examiner* — Glenn Zimmerman
(74) *Attorney, Agent, or Firm* — Christie, Parker & Hale, LLP

(57) ABSTRACT

Organic light emitting devices (OLEDs) are provided. An exemplary OLED includes a substrate, a first electrode, a second electrode, and an organic layer between the first and second electrodes having a hole injection layer and an emissive layer. The emissive layer includes red, green and blue emissive layers. The organic layer further includes an auxiliary layer selected from a first auxiliary layer between the hole injection layer and the red emissive layer for adjusting the resonance cycle of red light, a second auxiliary layer between the hole injection layer and the green emissive layer for adjusting the resonance cycle of green light, and combinations thereof. The material of the auxiliary layer is different from the material of the hole injection layer. The organic light emitting device has low turn-on voltage, high current density, high luminance, high current efficiency, high power, long life-time, and excellent color purity.

17 Claims, 5 Drawing Sheets

U.S. PATENT DOCUMENTS

| | | | |
|---|---|---|---|
| 2006/0017377 A1 | 1/2006 | Ryu | |
| 2008/0091021 A1* | 4/2008 | Kwok et al. | 546/10 |
| 2009/0206732 A1* | 8/2009 | Seo et al. | 313/504 |
| 2009/0261718 A1* | 10/2009 | Ha et al. | 313/504 |
| 2009/0309093 A1* | 12/2009 | Iwaki et al. | 257/40 |
| 2010/0001256 A1* | 1/2010 | Coe-Sullivan et al. | 257/13 |

FOREIGN PATENT DOCUMENTS

| | | |
|---|---|---|
| EP | 1 052 708 A2 | 11/2000 |
| EP | 1 450 419 A2 | 8/2004 |
| JP | 2000-323277 | 11/2000 |
| JP | 2005-197010 | 7/2005 |
| JP | 2005-235741 | 9/2005 |
| JP | 2006-041471 | 2/2006 |
| JP | 2006-253097 | 9/2006 |
| JP | 2006-286393 | 10/2006 |
| JP | 2007-26972 | 2/2007 |
| KR | 10-2005-0014437 | 2/2005 |
| KR | 10-2005-0040960 | 5/2005 |
| KR | 10-2005-0078472 | 8/2005 |
| KR | 10-2005-0079049 | 8/2005 |
| KR | 10-2006-0007899 A * | 1/2006 |
| KR | 10-2006-0079225 | 7/2006 |

OTHER PUBLICATIONS

Korean Patent Abstracts, Publication No. 1020050078472 A; Date of Publication: Aug. 5, 2005; in the name of Seok Jong Lee, et al.

Patent Abstracts of Japan, Publication No. 2005-197010; Date of Publication: Jul. 21, 2005; in the name of Koji Suzuki.

Patent Abstracts of Japan, Publication No. 2007-026972; Date of Publication: Feb. 1, 2007; in the name of Takashi Miyata.

Korean Patent Abstracts, Publication No. 1020050014437 A; Date of Publication: Feb. 7, 2005; in the name of Kwan Hee Lee, et al.

Korean Patent Abstracts, Publication No. 1020050079049 A; Date of Publication: Aug. 9, 2005; in the name of Bock Hyun Chung, et al.

Korean Patent Abstracts, Publication No. 1020060079225 A; Date of Publication: Jul. 5, 2006; in the name of Mitsuhiro Kashiwabara et al.

Japanese Office action dated Jun. 8, 2010, for corresponding Japanese Patent application 2008-126333, noting listed references in this IDS.

SIPO Office action dated Sep. 3, 2010, for corresponding Chinese Patent application 200810094765.0, noting listed reference in this IDS.

Japanese Office action dated Jul. 5, 2011, for corresponding Japanese Patent application 2008-126333.

* cited by examiner

ORGANIC LIGHT EMITTING DEVICE

CROSS-REFERENCE TO RELATED PATENT APPLICATION

This application claims priority to and the benefit of Korean Patent Application No. 10-2007-0047849, filed on May 16, 2007 in the Korean Intellectual Property Office, the entire content of which is incorporated herein by reference.

BACKGROUND OF THE INVENTION

1. Field of the Invention

The present invention relates to organic light emitting devices. More particularly, the invention is directed to an organic light emitting device including an auxiliary layer for adjusting the resonance cycle of red and/or green light.

2. Description of the Related Art

Organic light emitting devices (OLEDs) are self-emitting, have wide viewing angles, excellent contrast, quick response time, good operating voltages, and can realize multicolor images. Accordingly, much research has been conducted on the use of OLEDs in many commercial applications.

In general, OLEDs have anode/emissive layer/cathode structures. However, various other structures, such as anode/hole transport layer/emissive layer/cathode structures, anode/hole transport layer/emissive layer/electron injection layer/cathode structures, or the like, can be obtained by forming a hole injection layer, hole transport layer, and electron injection layer between the anode and emissive layer, or between the emissive layer and cathode.

SUMMARY OF THE INVENTION

According to one embodiment of the present invention, an organic light emitting device includes an auxiliary layer for adjusting the resonance cycle of red light and/or green light, thereby achieving high efficiency, long life-time, and the like.

According to one embodiment of the present invention, an organic light emitting device comprises a substrate, a first electrode, a second electrode, and an organic layer comprising a hole injection layer and an emissive layer disposed between the first electrode and the second electrode. The emissive layer comprises a red emissive layer, a green emissive layer, and a blue emissive layer. The organic layer comprises at least one layer selected from a) a first auxiliary layer disposed between the hole injection layer and the red emissive layer for adjusting the resonance cycle of red light, and b) a second auxiliary layer disposed between the hole injection layer and the green emissive layer for adjusting the resonance cycle of green light. The material of the first auxiliary layer is different from the material of the hole injection layer, and the material of the second auxiliary layer is different from the material of the hole injection layer.

According to one embodiment, the organic light emitting device has low turn-on voltage, high current density, high luminance, high current efficiency, high power, long life-time, and excellent color purity.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

The present invention will now be described more fully with reference to the accompanying drawings, in which exemplary embodiments of the invention are shown.

Figure 1:
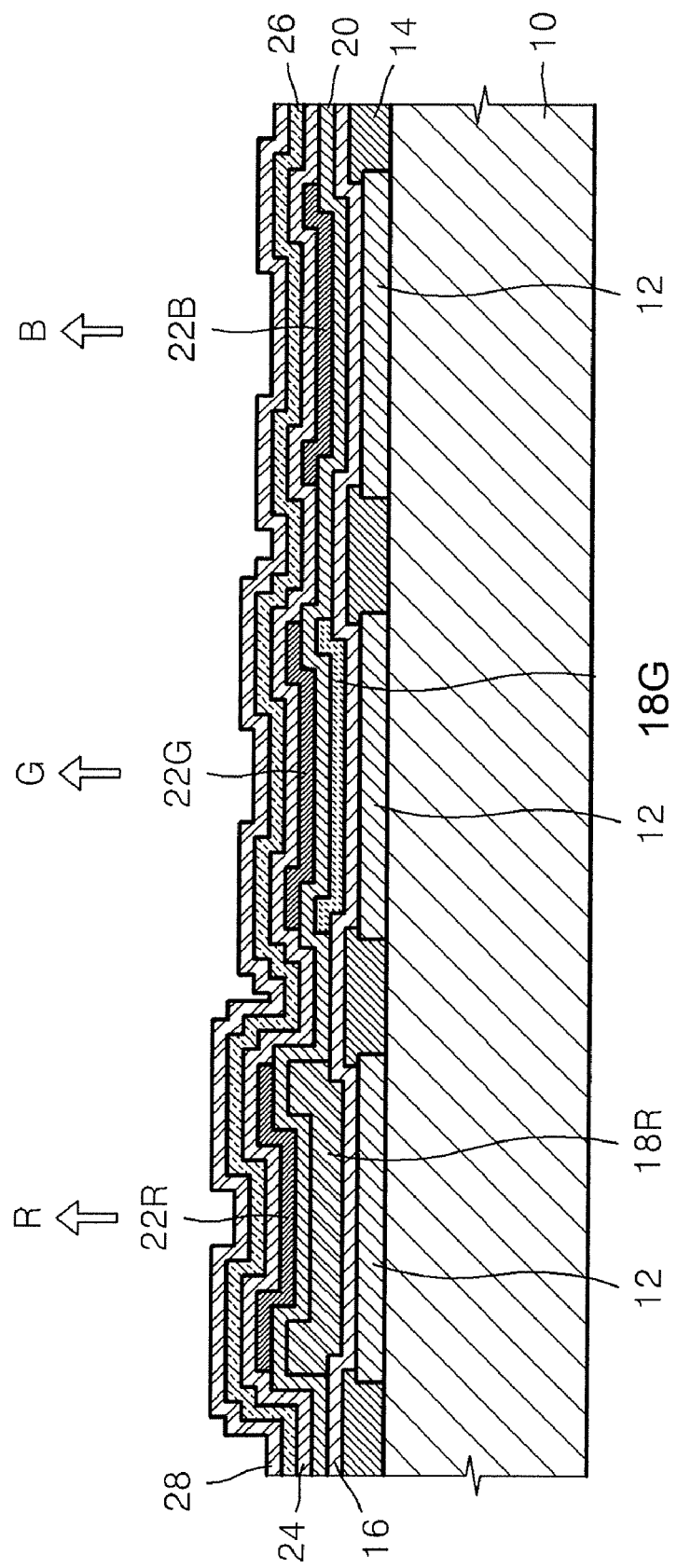
FIG. 1 is a schematic cross-sectional view of an organic light emitting device according to an embodiment of the present invention.

FIG. 1 is a schematic cross-sectional view of an organic light emitting device according to one embodiment of the present invention. Referring to FIG. 1, an organic light emitting device includes a substrate 10, a first electrode 12, a hole injection layer 16, and a red emissive layer 22R, a green emissive layer 22G and a blue emissive layer 22B. A first auxiliary layer 18R is disposed between the hole injection layer 16 and the red emissive layer 22R for adjusting the resonance cycle of red light. A second auxiliary layer 18G is disposed between the hole injection layer 16 and the green emissive layer 22G for adjusting the resonance cycle of green light. A hole transport layer 20 is disposed beneath the red emissive layer 22R, the green emissive layer 22G, and the blue emissive layer 22B. An electron transport layer 24, an electron injection layer 26, and a second electrode 28 are disposed (in that order) on the red emissive layer 22R, the green emissive layer 22G, and the blue emissive layer 22B.

Although the OLED in FIG. 1 is depicted as including a first auxiliary layer 18R and a second auxiliary layer 18G, other embodiments may include only a first auxiliary layer 18R, or only a second auxiliary layer 18G.

In FIG. 1, the substrate 10 can be any substrate that is used in conventional organic light emitting devices. For example, the substrate may be a glass substrate or a transparent plastic substrate that has excellent mechanical strength, thermal stability, transparency, and surface smoothness, can be easily treated, and is waterproof. Although not illustrated in FIG. 1, the organic light emitting device may further include a planarization film, an insulating layer, or the like on the substrate 10.

First electrodes 12 are disposed on the substrate 10. As illustrated in FIG. 1, the first electrodes 12 may be patterned to form red sub pixels (R), green sub pixels (G) and blue sub pixels (B), and may be anodes or cathodes. Nonlimiting examples of suitable first electrodes 12 may be transparent electrodes, semi-transparent electrodes, or reflective electrodes formed of ITO, IZO, $SnO_2$, ZnO, Al, Ag, Mg or the like. In addition, various modifications may be made, such as to the structure of at least two layers being formed of at least two different materials, or the like.

Insulating layers 14 may be disposed on both edges of the first electrodes 12. The insulating layers 14 may be made of a conventional insulating material, an inorganic material such as $SiO_2$, $SiN_x$ or the like, an organic material such as a polyimide-based resin, an acryl-based resin or the like, or similar such materials.

The hole injection layer 16 is formed on the first electrodes 12. The hole injection layer 16 may be formed as a common layer over the red, green, and blue sub pixels as illustrated in FIG. 1, rather than being independently formed on each red, green, and blue sub pixel. Thus, the manufacturing costs of the organic light emitting device can be reduced.

The hole injection layer 16 can be formed using various methods such as vacuum deposition, spin coating, casting, Langmuir Blodgett (LB), or the like.

When the hole injection layer 16 is formed by vacuum deposition, the vacuum deposition conditions may vary according to the compound used to form the hole injection layer 16, and the desired structure and thermal properties of the hole injection layer 16 to be formed. In general, however, vacuum deposition may be performed at a deposition temperature ranging from about 100 to about 500° C., a pressure ranging from about $10^{-3}$ to about $10^{-3}$ torr, and a deposition speed ranging from about 0.01 to about 100 Å/sec.

When the hole injection layer 16 is formed by spin coating, the coating conditions may vary according to the compound used to form the hole injection layer 16, and the desired structure and thermal properties of the hole injection layer 16 to be formed. In general, however, the coating speed may range from about 2,000 to about 5,000 rpm, and the heat treatment temperature (performed to remove solvent after coating) may range from about 80 to about 200° C.

The material of the hole injection layer may have a HOMO energy level ranging from about −4.5 eV to about −5.5 eV. In one embodiment, for example, the HOMO energy level ranges from about −4.9 eV to about −5.2 eV. When the hole injection layer is formed of a material having a HOMO energy level outside these ranges, it is difficult to control charge balance.

Nonlimiting examples of suitable materials for use as the hole injection layer include phthalocyanine compounds (such as copperphthalocyanine), star-burst type amine derivatives (such as TCTA, m-MTDATA, or m-MTDAPB), soluble and conductive polymers (such as polyaniline/Dodecylbenzenesulfonic acid (PANI/DBSA)), poly(3,4-ethylened ioxythiophene)/poly(4-styrenesulfonate) (PEDOT/PSS), polyaniline/camphor sulfonic acid (Pani/CSA), (polyaniline)/poly (4-styrenesulfonate) (PANI/PSS), LHT-100 obtained from LUDIS, and the like.

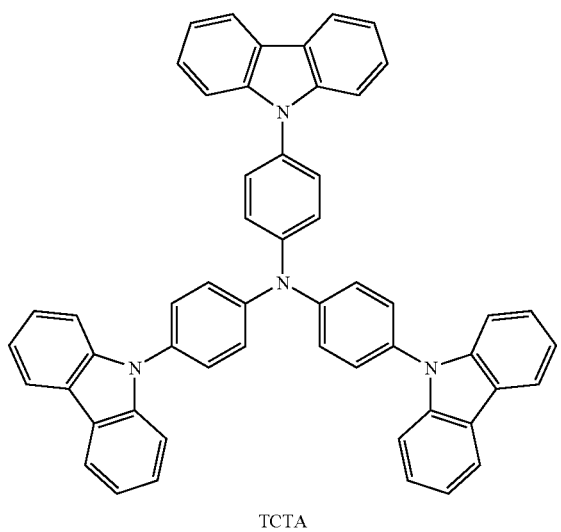

TCTA

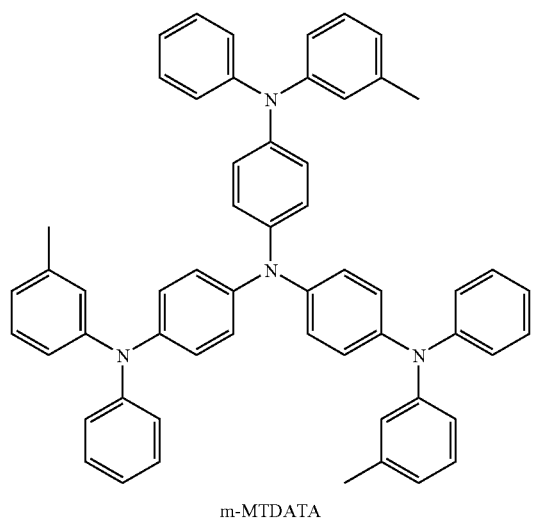

m-MTDATA

The thickness of the hole injection layer may range from about 10 to about 200 nm. In one embodiment, for example, the thickness of the hole injection layer ranges from about 60 to about 150 nm. The thickness of the hole injection layer may be selected in consideration of processing time and manufacturing cost.

The first auxiliary layer 18R is formed on a portion of the hole injection layer 16 corresponding to a red subpixel, and the second auxiliary layer 18G is formed on a portion of the hole injection layer 16 corresponding to a green subpixel. The first auxiliary layer 18R adjusts the thickness of the organic layer of the red subpixel in order to control the resonance cycle of red light. The second auxiliary layer 18G adjusts the thickness of the organic layer of the green subpixel in order to control the resonance cycle of green light.

Red light, green light, and blue light are emitted from the organic layers formed between the first electrodes 12 and a second electrode 28, resonate between the first electrodes 12 and the second electrode 28, and are ejected to the outside of the organic light emitting device. When the light resonating between the first electrodes 12 and the second electrode 28 generates a constructive interference, the light emitting efficiency, luminance, and the like of the organic light emitting device may further be improved. However, each of the red light, the green light, and the blue light has a different wavelength (red light wavelength>green light wavelength>blue light wavelength). Thus, the resonance distance needed for the generation of optical constructive interference is different for each color. The resonance distance needed for the generation of optical constructive interference is the distance between the first electrode 12 and the second electrode 28, and each of the resonance distances of the red light, the green light and the blue light correspond to the thickness of the organic layer at the red subpixel, green subpixel and blue subpixel.

As described above, the hole injection layer 16 may be formed as a common layer over the red, green, and blue subpixels in order to improve the manufacturing efficiency as illustrated in FIG. 1. The thickness of the hole injection layer 16 is conventionally adjusted to generate an optical constructive interference with respect to the blue light by taking into consideration the wavelength of the blue light (which has the shortest wavelength among red, green and blue light) in order to adjust the resonance cycle of the blue light. In this case, the light emitting efficiency, the color coordinate, and the like of the red light and the green light can lead to loss. To compensate for the loss (i.e., to adjust the thickness of the organic layer at the red subpixel and green subpixel so that even the red light and green light generate an optical constructive interference), the first auxiliary layer 18R and the second auxiliary layer 18G may be formed corresponding to the red subpixel and the green subpixel, respectively, as illustrated in FIG. 1.

The material of the first auxiliary layer 18R may be different from the material of the hole injection layer 16 in order to improve light emitting efficiency, color purity, and the like of the red light. For example, the HOMO energy level of the material of the first auxiliary layer 18R may be within about ±0.5 eV of the HOMO energy level of the material of the hole injection layer 16. In one embodiment, for example, the HOMO energy level of the material of the first auxiliary layer 18R may be within about ±0.3 eV of the HOMO energy level of the material of hole injection layer. When the HOMO energy level of the material of the first auxiliary layer 18R is outside these ranges, light emitting efficiency, color purity, and the like of the red light is not optimized. For example, when LHT-001 obtained from LUDIS is selected as the material of the hole injection layer 16, a material having a HOMO energy level ranging from about −5.6 to about −4.6 eV may be selected as the material of the first auxiliary layer 18R since the HOMO energy level of LHT-001 of LUDIS is about −5.1 eV.

The hole mobility of the material of the first auxiliary layer 18R may range from about 1.5 to 2 times that of 4,4'-bis[N-(1-naphthyl)-N-phenylamino]biphenyl (NPB). The hole mobility of NPB varies according to measurement conditions (i.e., temperature, applied electric field, and the like) and measurement methods, but may be approximately $2.3 \times 10^{-3}$ cm$^2$/V.s (under a condition of $4 \times 10^5$ V/cm). For example, the hole mobility of the material of the first auxiliary layer 18R may range from about $3.45 \times 10^{-3}$ to about $4.6 \times 10^{-3}$ cm$^2$/V.s, but is not limited thereto, taking into consideration that the hole mobility of NPB can vary according to measurement conditions and methods.

The thickness of the first auxiliary layer 18R may range from about 60 to about 100 nm. In one embodiment, for example, the thickness of the first auxiliary layer 18R may range from about 70 to about 90 nm. When the thickness of the first auxiliary layer 18R is outside these ranges, it is difficult to adjust the resonance cycle of the red light. Thus, red light having excellent light emitting efficiency, long lifetime, high color purity, and the like is difficult to obtain.

The material of the second auxiliary layer 18G may be different from the material of the hole injection layer 16 in order to improve the light emitting efficiency, color purity, and the like of the green light. For example, the HOMO energy level of the material of the second auxiliary layer 18G may be within about ±0.5 eV of the HOMO energy level of the material of the hole injection layer 16. In one embodiment, for example, the HOMO energy level of the material of the second auxiliary layer 18G may be within about ±0.3 eV of the HOMO energy level of the material of the hole injection layer 16. When the HOMO energy level of the material of the second auxiliary layer 18G is outside these ranges, the light emitting efficiency, color purity, and the like of the green light is not optimized. For example, when LHT-001 obtained from LUDIS is selected as the material of the hole injection layer 16, a material having a HOMO energy level ranging from about −5.6 to about −4.6 eV may be selected as the material of the second auxiliary layer 18G since the HOMO energy level of LHT-001 of LUDIS is about −5.1 eV.

The hole mobility of the material of the second auxiliary layer 18G may range from about 1.5 to about 2 times that of 4,4'-bis[N-(1-naphthyl)-N-phenylamino]biphenyl (NPB). The hole mobility of NPB varies according to measurement conditions (i.e., temperature, applied electric field, and the like) and measurement methods, but may be approximately $2.3 \times 10^{-3}$ cm$^2$/V.s (under the condition of $4 \times 10^5$ V/cm). For example, the hole mobility of the material of the second auxiliary layer 18G may range from about $3.45 \times 10^{-3}$ to about $4.6 \times 10^{-3}$ cm$^2$/V.s, but is not limited thereto, taking into consideration that the hole mobility of NPB can vary according to measurement conditions and methods.

The thickness of the second auxiliary layer 18G may range from about 20 to about 60 nm. In one embodiment, for example, the thickness of the second auxiliary layer 18G may range from about 30 to about 50 nm. When the thickness of the second auxiliary layer 18G is outside these ranges, it is difficult to adjust the resonance cycle of the green light. Thus, green light having excellent light emitting efficiency, long life-time, high color purity, and the like is difficult to obtain.

The materials of the first auxiliary layer 18R and the second auxiliary layer 18G can be the same or different from each other, as long as they are different from the material used to form the hole injection layer 16. More particularly, the material of the first auxiliary layer 18R and/or the second auxiliary layer 18G may be selected from compounds represented by Formula 1 below:

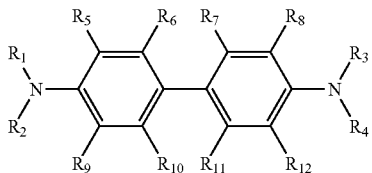

Formula 1

In Formula 1, each of $R_1$ through $R_{12}$ is independently selected from hydrogen, hydroxyl groups, cyano groups, substituted or unsubstituted $C_1$-$C_{30}$ alkyl groups (e.g., substituted or unsubstituted $C_1$-$C_{10}$ alkyl groups), substituted or unsubstituted $C_1$-$C_{30}$ alkoxy groups (e.g., substituted or unsubstituted $C_1$-$C_{10}$ alkoxy groups), substituted or unsubstituted $C_2$-$C_{30}$ alkenyl groups (e.g., substituted or unsubstituted $C_2$-$C_{10}$ alkenyl groups), substituted or unsubstituted $C_2$-$C_{30}$ alkynyl groups (e.g., substituted or unsubstituted $C_2$-$C_{10}$ alkynyl groups), substituted or unsubstituted $C_6$-$C_{30}$ aryl groups (e.g., substituted or unsubstituted $C_6$-$C_{20}$ aryl groups), substituted or unsubstituted $C_3$-$C_{30}$ heteroaryl groups (e.g., substituted or unsubstituted $C_3$-$C_{20}$ heteroaryl groups), and —$N(A_1)(A_2)$ groups. In —$N(A_1)(A_2)$, each of $A_1$ and $A_2$ is independently selected from substituted or unsubstituted $C_6$-$C_{30}$ aryl groups (e.g., substituted or unsubstituted $C_6$-$C_{20}$ aryl groups), and substituted or unsubstituted $C_3$-$C_{30}$ heteroaryl groups (e.g., substituted or unsubstituted $C_3$-$C_{20}$ heteroaryl groups).

Nonlimiting examples of suitable unsubstituted $C_1$-$C_{30}$ alkyl groups include methyl, ethyl, propyl, isobutyl, sec-butyl, pentyl, iso-amyl, hexyl, and the like. At least one hydrogen atom of the $C_1$-$C_{30}$ alkyl group may be substituted with a substituent selected from halogen atoms, hydroxyl groups, nitro groups, cyano groups, amino groups, amidino groups, hydrazine, hydrazone, carboxyl groups and salts thereof, sulfonic acid groups and salts thereof, phosphoric acid and salts thereof, $C_1$-$C_{30}$ alkyl groups, $C_1$-$C_{30}$ alkenyl groups, $C_1$-$C_{30}$ alkynyl groups, $C_6$-$C_{30}$ aryl groups, $C_7$-$C_{20}$ arylalkyl groups, $C_2$-$C_{20}$ heteroaryl groups, $C_3$-$C_{30}$ heteroarylalkyl groups, $C_6$-$C_{30}$ aryloxy groups, and —$N(Z_1)(Z_2)$ groups. In —$N(Z_1)(Z_2)$, each of $Z_1$ and $Z_2$ may be independently selected from hydrogen, substituted or unsubstituted $C_1$-$C_{30}$ alkyl groups, substituted or unsubstituted $C_6$-$C_{30}$ aryl groups, and substituted or unsubstituted $C_2$-$C_{30}$ heteroaryl groups.

The unsubstituted $C_1$-$C_{30}$ alkoxy group may be represented by —OX, where X is an alkyl group as described above. Nonlimiting examples of suitable unsubstituted $C_1$-$C_{30}$ alkoxy groups include methoxy, ethoxy, phenyloxy, cyclohexyloxy, naphthyloxy, isopropyloxy, diphenyloxy, and the like. At least one hydrogen atom of these alkoxy groups can be substituted with the same substituents as in the unsubstituted $C_1$-$C_{30}$ alkyl groups described above.

The unsubstituted $C_2$-$C_{30}$ alkenyl groups are groups containing at least one carbon-carbon double bond in the middle or at the end-most part of the alkyl group as defined above. Nonlimiting examples of suitable groups include ethylene, propylene, butylene, hexylene, and the like. At least one hydrogen atom of these alkenyl groups can be substituted with the same substituents as in the unsubstituted $C_1$-$C_{30}$ alkyl groups described above.

The unsubstituted $C_2$-$C_{30}$ alkynyl groups are groups containing a carbon-carbon triple bond at the middle or end-most part of the alkyl group as defined above. Nonlimiting examples of suitable unsubstituted $C_2$-$C_{30}$ alkynyl groups include acetylene, propylene, phenylacetylene, naphthylacetylene, isopropylacetylene, t-butylacetylene, diphenylacetylene, and the like. At least one hydrogen atom of these alkynyl groups can be substituted with the same substituents as in the unsubstituted $C_1$-$C_{30}$ alkyl groups described above.

The unsubstituted $C_6$-$C_{30}$ aryl groups are $C_6$-$C_{30}$ carbocyclic aromatic systems containing at least one aromatic ring. The at least one aromatic ring may be fused together, or bound by a single bond or the like. At least one hydrogen atom of the aryl group can be substituted with the same substituents as in the unsubstituted $C_1$-$C_{30}$ alkyl groups described above.

In Formula 1, nonlimiting examples of suitable substituted or unsubstituted $C_6$-$C_{30}$ aryl groups include phenyl groups, $C_1$-$C_{10}$ alkylphenyl groups (for example, ethylphenyl groups), halophenyl groups (for example, o-, m- and p-fluorophenyl groups, and dichlorophenyl groups), cyanophenyl groups, dicyanophenyl groups, trifluoromethoxyphenyl groups, biphenyl groups, halobiphenyl groups, cyanobiphenyl groups, $C_1$-$C_{10}$ biphenyl groups, $C_1$-$C_{10}$ alkoxybiphenyl groups, o-, m-, and p-tolyl groups, o-, m-, and p-cumenyl groups, mesityl groups, phenoxyphenyl groups, (α,α-dimethylbenzene)phenyl groups, (N,N'-dimethyl)aminophenyl groups, (N,N'-diphenyl)aminophenyl groups, pentalenyl groups, indenyl groups, naphthyl groups, halonaphthyl groups (for example, fluoronaphthyl groups), $C_1$-$C_{10}$ alkylnaphthyl groups (for example, methylnaphthyl groups), $C_1$-$C_{10}$ alkoxynaphthyl groups (for example, methoxynaphthyl groups), cyanonaphthyl groups, anthracenyl groups, azulenyl groups, heptalenyl groups, acenaphthylenyl groups, phenalenyl groups, fluorenyl groups, anthraquinolyl groups, methylanthryl groups, phenanthrenyl groups, triphenylenyl groups, pyrenyl groups, chrysenyl groups, ethyl-chrysenyl groups, picenyl groups, perylenyl groups, chloroperylenyl groups, pentaphenyl groups, pentacenyl groups, tetraphenylenyl groups, hexaphenyl groups, hexacenyl groups, rubicenyl groups, coronenyl groups, trinaphthylenyl groups, heptaphenyl groups, heptacenyl groups, pyranthrenyl groups, ovalenyl groups, and the like.

The unsubstituted $C_3$-$C_{30}$ heteroaryl groups are systems comprising at least one aromatic ring having at least one hetero atom selected from N, O, P and S, the remaining ring atom being carbon (C). The at least one aromatic ring may be fused together, or bound by a single bond or the like. At least one hydrogen atom of the heteroaryl group can be substituted with the same substituents as in the unsubstituted $C_1$-$C_{30}$ alkyl groups described above.

Nonlimiting examples of suitable unsubstituted $C_3$-$C_{30}$ heteroaryl groups include pyrazolyl groups, imidazolyl groups, oxazolyl groups, thiazolyl groups, triazolyl groups, tetrazolyl groups, oxadiazolyl groups, pyridinyl groups, pyridazinyl groups, pyrimidinyl groups, triazinyl groups, carbazolyl groups, indolyl groups, quinolinyl groups, isoquinolinyl groups, and the like. The unsubstituted $C_3$-$C_{30}$ heteroaryl groups can be substituted with the same substituents as in the unsubstituted $C_1$-$C_{30}$ alkyl groups described above.

In one embodiment, each of $R_1$ through $R_{12}$ is independently selected from hydrogen, phenyl groups, (N,N'-diphenyl)aminophenyl groups, naphthyl groups, anthracenyl groups, or N-phenylcarbazolyl groups.

The first auxiliary layer 18R and the second auxiliary layer 18G may be formed using various methods such as vacuum deposition, spin coating, casting, Langmuir Blodgett (LB), or the like. When the first auxiliary layer 18R and the second auxiliary layer 18G are formed by vacuum deposition or spin coating, the vacuum deposition conditions or coating conditions may vary according to the compound used to form the first auxiliary layer 18R and the second auxiliary layer 18G. However, in general, the deposition and coating conditions may be nearly the same as those used for the formation of the hole injection layer 16.

A hole transport layer 20 is formed on the first auxiliary layer 18R, the second auxiliary layer 18G, and the hole injection layer 16. The hole transport layer 20 may be formed using various methods such as vacuum deposition, spin coating, casting, Langmuir Blodgett (LB), or the like. When the hole transport layer 20 is formed by vacuum deposition or spin coating, the vacuum deposition conditions or coating conditions may vary according to the compound used to form the hole transport layer 20. However, in general, the deposition and coating conditions may be nearly the same as those used for the formation of the hole injection layer 16.

A known hole transporting material may be used as the material of the hole transport layer. Nonlimiting examples of suitable hole transporting materials include carbazole derivatives (such as N-phenylcarbazole, polyvinylcarbazole and the like), conventional amine derivatives having aromatic condensation rings (such as 4,4'-bis[N-(1-naphthyl)-N-phenylamino]biphenyl (NPB), N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD) and the like), and the like.

The thickness of the hole transport layer 20 may range from about 15 to about 100 nm. In one embodiment, for example, the thickness ranges from about 20 to about 70 nm. Within these ranges, excellent hole transporting properties and low turn-on voltages can be obtained.

Next, a red emissive layer 22R, a green emissive layer 22G and a blue emissive layer 22B are formed on the hole transport layer 20 corresponding to their respective subpixels. The red emissive layer 22R, the green emissive layer 22G and the blue emissive layer 22B may be formed using methods such as vacuum deposition, spin coating, casting, Langmuir Blodgett (LB), or the like. When the red, green and blue emissive layers 22R, 22G, and 22B are formed by vacuum deposition or spin coating, the vacuum deposition conditions or coating conditions vary according to the compound used to form the emissive layers. However, in general, the deposition or coating conditions may be nearly the same as those used to form the hole injection layer 16.

The emissive layers may include various known light emitting materials such as known hosts and dopants. As for the dopant, both known fluorescent dopants and known phosphorescent dopants can be used.

Nonlimiting examples of suitable hosts include $Alq_3$, 4,4'-N,N'-dicarbazole-biphenyl (CBP), poly(n-vinylcarbazole) (PVK), distyrylarylene (DSA), GDI1403 obtained from Gracel company (red phosphorescent host), GGH01 obtained from Gracel company (green fluorescent host), and the like.

Nonlimiting examples of suitable fluorescent dopants include IDE102, IDE105 and IDE118 obtained from Idemitsu Co. In addition, nonlimiting examples of suitable phosphorescent dopants include $Ir(ppy)_3$ (ppy=phenylpyridine) (green), green fluorescent dopant GD01 obtained from Gracel company, $(4,6-F2\ ppy)_2Irpic$, TEB002 obtained from Covion company, platinum(II) octaethylporphyrin (PtOEP), compounds represented by Formula 2 below, Firpic, and tris (1-phenylisoquinoline) iridium (III) $(Ir(piq)_3)$.

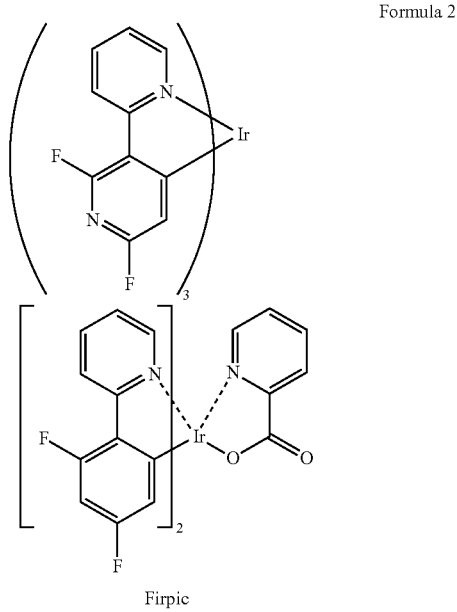

Formula 2

Firpic

An amount of the dopant may range from about 0.1 to about 20 parts by weight based on 100 parts by weight (i.e., the total weight of the host and dopant is 100 parts by weight) of the material of the emissive layer. In one embodiment, for example, the amount of the dopant may range from about 0.5 to about 15 parts by weight based on 100 parts by weight of the material of the emissive layer. When the amount of dopant is less than about 0.1 parts by weight based on 100 parts by weight of the material of the emissive layer, the effect accruing from the addition of the dopant is insignificant. When the amount of dopant is greater than about 20 parts by weight based on 100 parts by weight of the material of the emissive layer, concentration quenching may occur with phosphorescent and fluorescent dopants.

The thickness of the emissive layer may range from about 10 to about 100 nm. In one embodiment, for example, the thickness ranges from about 10 to about 60 nm. When the thickness of the emissive layer is greater than about 10 nm, excellent emissive abilities of the emissive layer can be obtained. When the thickness of the emissive layer is less than 100 nm, increases in the turn-on voltage of the organic light emitting device can be substantially prohibited.

When the emissive layer includes a phosphorescent dopant, a hole blocking layer (HBL) can be formed on the emissive layer in order to prevent triplet excitons or holes from migrating into the electron transport layer (not shown in FIG. 1). The material of the HBL is not particularly limited, and can be any known HBL material. Nonlimiting examples of suitable materials include oxadiazole derivatives, triazole derivatives, phenanthroline derivatives, Balq, BCP, and the like.

The thickness of the HBL may range from about 5 to about 100 nm. In one embodiment, for example, the thickness ranges from about 10 to about 30 nm. When the thickness of the HBL is greater than about 5 nm, hole blocking ability can be effectively obtained. When the thickness of the HBL is less than about 100 nm, increases in turn-on voltage of the organic light emitting device can be substantially prohibited.

An electron transport layer (ETL) 24 is formed on the emissive layer. The ETL 24 may be formed using various methods such as vacuum deposition, spin coating, casting, or the like. When the ETL 24 is formed by vacuum deposition or spin coating, the conditions for deposition or coating are, in general, similar to those for the formation of the hole injection layer 16, although the conditions for the deposition or coating may vary according to the material used to form the ETL 24.

The material of the ETL is not particularly limited, and may be selected from known electron transporting materials. Nonlimiting examples of suitable materials include quinoline derivatives, in particular, tris(8-quinolinorate)aluminum ($Alq_3$), TAZ, or the like, which are known in the art.

The thickness of the ETL 24 may range from about 10 to about 100 nm. In one embodiment, for example, the thickness ranges from about 10 to about 50 nm. When the thickness of the ETL 24 is greater than about 10 nm, electron transporting abilities can be effectively obtained. When the thickness of the ETL 24 is less than about 100 nm, increases in turn-on voltage of the organic light emitting device can be substantially prohibited.

In addition, an electron injection layer (EIL) 26 may be formed on the ETL 24. The EIL makes it easy for electrons to be injected from the cathode. The EIL 26 may be formed using various methods such as vacuum deposition, spin coating, casting, or the like. When the EIL 26 is formed by vacuum deposition or spin coating, the conditions for deposition or coating are, in general, similar to those for the formation of the hole injection layer 16, although the conditions for the deposition or coating may vary according to the material used to form the EIL 26.

The EIL 26 may be formed of an electron injecting material such as LiF, NaCl, CsF, $Li_2O$, BaO, or the like, which are known in the art. The thickness of the EIL 26 may range from about 0.1 to about 10 nm. In one embodiment, for example, the thickness ranges from about 0.5 to about 9 nm. When the thickness of the EIL 26 is greater than about 0.1 nm, electron injecting abilities can be effectively obtained. When the thickness of the EIL 26 is less than about 10 nm, increases in turn-on voltage of the organic light emitting device can be substantially prohibited.

Finally, a second electrode 28 is formed on the EIL 26. The second electrode 28 may be formed by vacuum deposition, sputtering or the like, and may be a cathode or an anode. The second electrode may be formed of a low work-function metal, an alloy, an electrically conductive compound, or a combination thereof. In particular, the second electrode may be formed of Li, Mg, Al, Al—Li, Ca, Mg—In, Mg—Ag, or the like. In addition, various modifications, such as to the structure of at least two layers being formed of at least two different materials, or the like are possible.

An organic light emitting device according to the present invention has been described with reference to FIG. 1 (illustrating a structure of an organic light emitting device), but the present invention is not limited thereto and various modifications are possible.

Hereinafter, the present invention will be described with respect to the following Examples. However, the Examples are provided for illustrative purposes only and do not limit the scope of the present invention.

EXAMPLE 1

As an anode, a 15 $\Omega/cm^2$ (1200 Å) ITO glass substrate was cut to a size of 50 mm×50 mm×0.7 mm, and microwave-washed with isopropyl alcohol and pure water for 5 minutes, respectively. The ITO glass substrate was irradiated with ultraviolet rays for 30 minutes and washed with ozone, and then installed in a vacuum deposition device.

A hole injecting material (Product name: LHT-001 obtained from LUDIS) was vacuum-deposited on the glass substrate to form a hole injection layer having a thickness of 130 nm. Subsequently, a hole transporting material (Product name: IDE-406 obtained from Idemitsu Co.) was vacuum-deposited to form a first auxiliary layer having a thickness of 80 nm. 4,4'-bis[N-(1-naphthyl)-N-phenylamino]biphenyl (NPB) was then vacuum-deposited on the first auxiliary layer to form a hole transport layer having a thickness of 20 nm.

A known red phosphorescent host GDI1403 obtained from Gracel company and a known red phosphorescent dopant $Ir(piq)_3$ (dopant amount: 15 wt %) were co-deposited on the hole transport layer to form a red phosphorescent emissive layer having a thickness of 20 nm.

Subsequently, $Alq_3$ was vacuum-deposited on the emissive layer to form an electron transport layer having a thickness of 30 nm. LiF was then vacuum-deposited on the electron transport layer to form an electron injection layer having a thickness of 0.5 nm, and Mg:Ag was vacuum-deposited to a thickness of 16 nm to manufacture an organic light emitting device.

EXAMPLE 2

An organic light emitting device was manufactured as in Example 1, except that HTM016 obtained from Merck was used instead of IDE406 obtained from Idemitsu Co. as the first auxiliary layer.

COMPARATIVE EXAMPLE 1

An organic light emitting device was manufactured as in Example 1, except that LHT-001 (used to form the hole injection layer) was used instead of IDE406 obtained from Idemitsu Co. as the first auxiliary layer.

EVALUATION EXAMPLE 1

Figure 2:
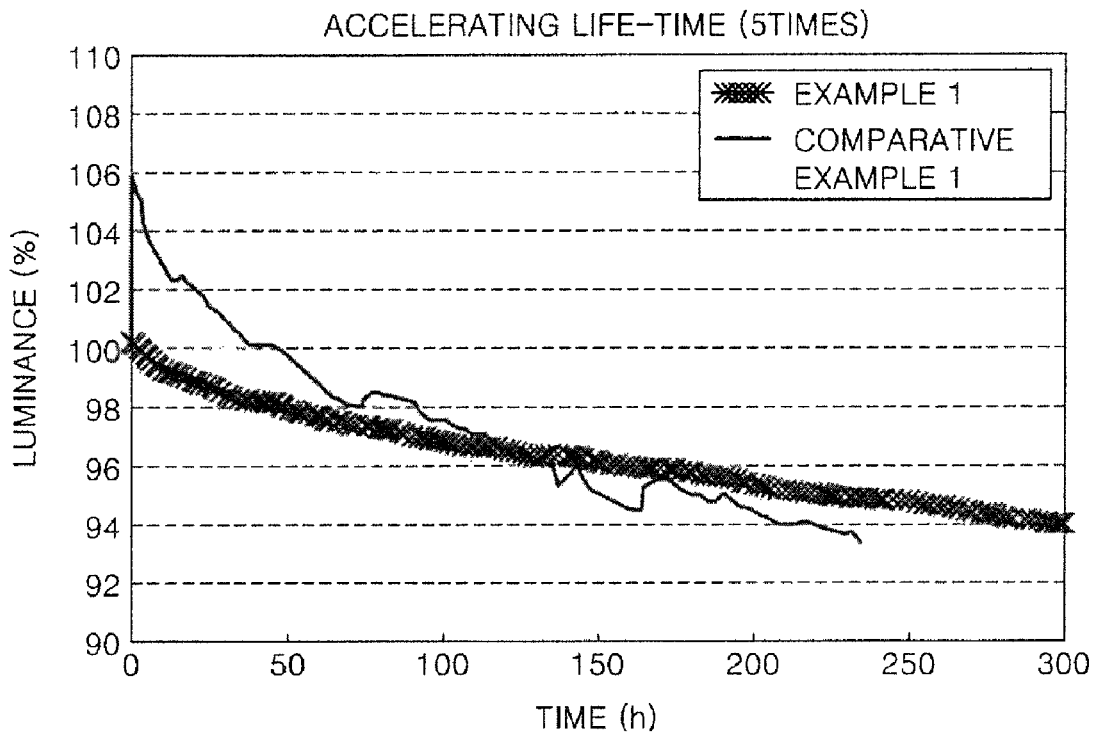
FIG. 2 is a graph comparing the accelerating life-times of the organic light emitting device prepared according to Example 1 and the organic light emitting device prepared according to Comparative Example 1.
Figure 3:
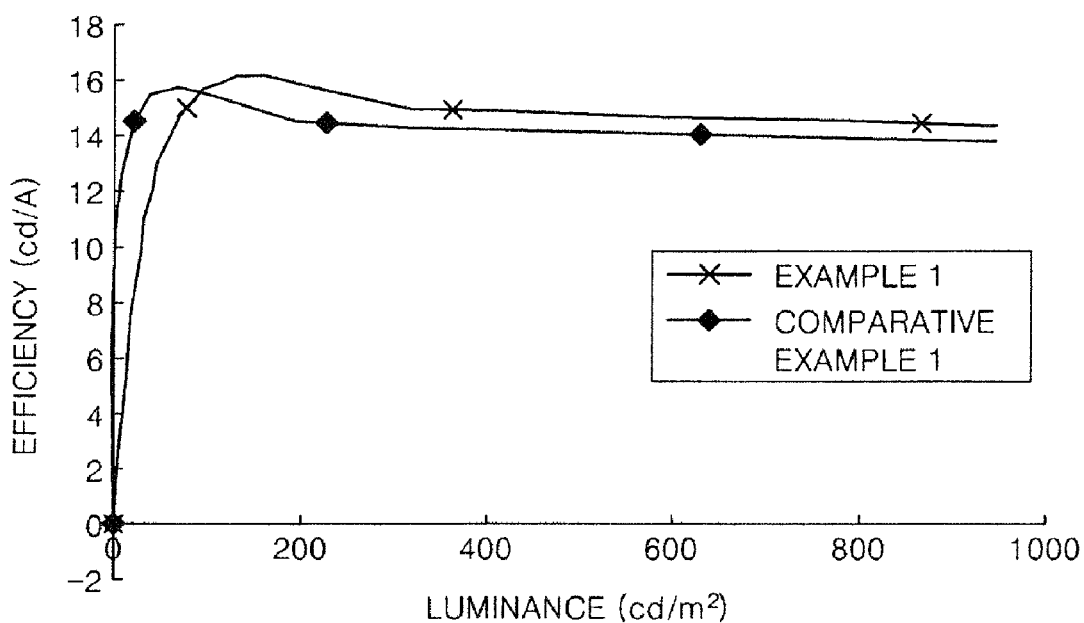
FIG. 3 is a graph comparing the efficiencies of the organic light emitting device prepared according to Example 1 and the organic light emitting device prepared according to Comparative Example 1.
Figure 4:
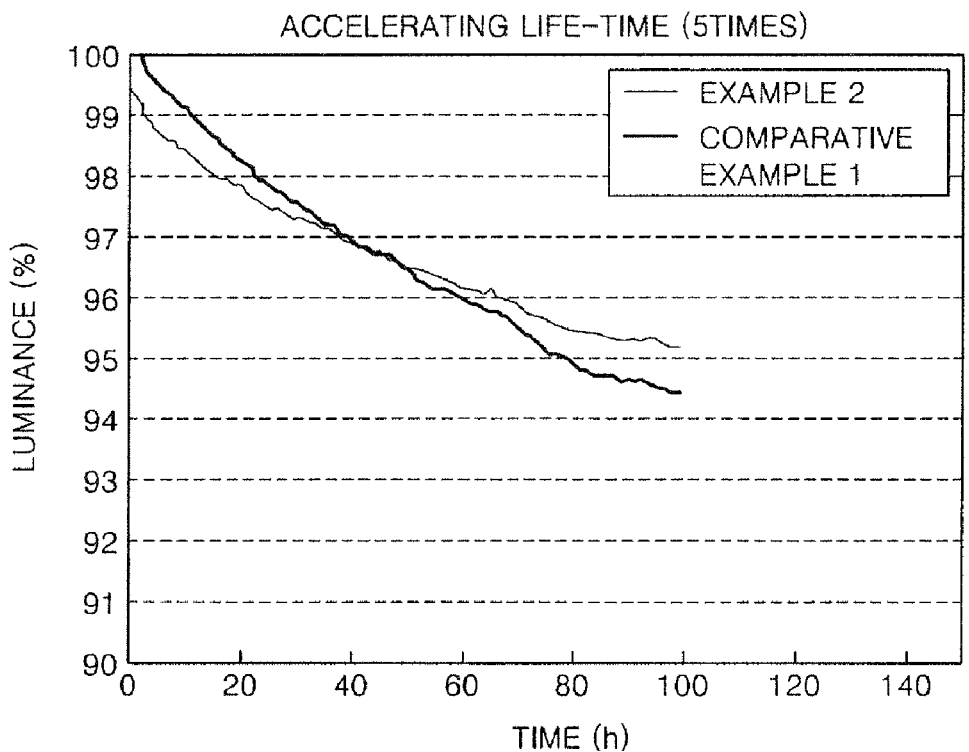
FIG. 4 is a graph comparing the accelerating life-times of the organic light emitting device prepared according to Example 2 and the organic light emitting device prepared according to Comparative Example 1.
Figure 5:
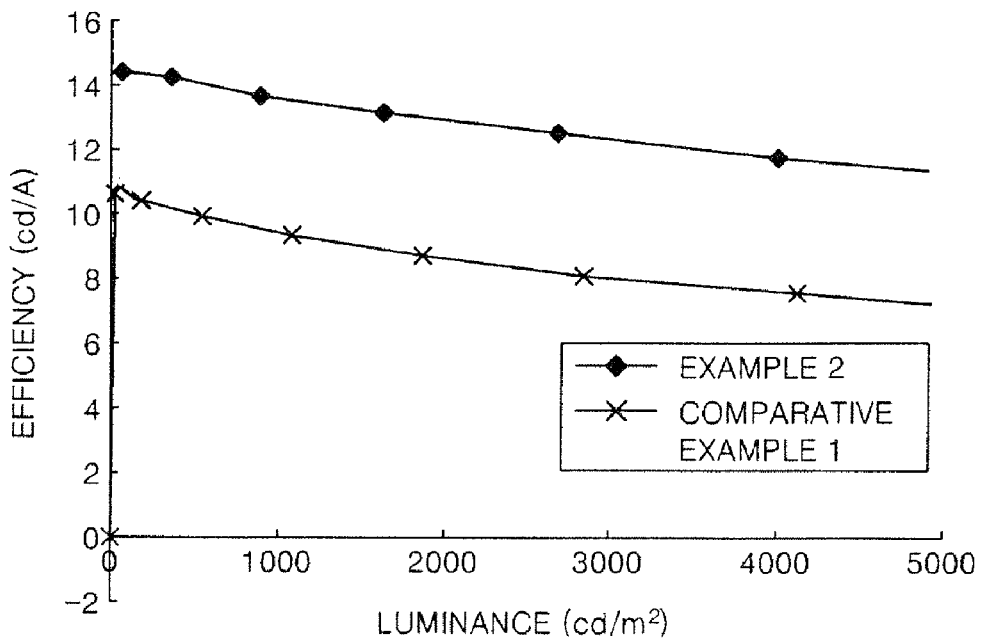
FIG. 5 is a graph comparing the efficiencies of the organic light emitting device prepared according to Example 2 and the organic light emitting device prepared according to Comparative Example 1.

Turn-on voltages, current densities, luminance, current efficiencies, power, and color coordinates of the organic light emitting devices of Examples 1 and 2 and Comparative Example 1 were evaluated using a PR650 Spectroscan spectrometer (from PHOTO RESEARCH INC.). The results are shown in Table 1 below. In addition, accelerating life-time (5 times) data of the organic light emitting devices of Example 1 and Comparative Example 1 are shown in FIG. 2, and current efficiency data thereof are shown in FIG. 3. In addition, accelerating life-time (5 times) data of the organic light emitting devices of Example 2 and Comparative Example 1 are shown in FIG. 4, and current efficiency data thereof are shown in FIG. 5.

TABLE 1

|  | Example 1 | Example 2 | Comparative Example 1 |
|---|---|---|---|
| Turn-on voltage (V) | 3.437 | 3.425 | 4.137 |
| Current density (mA/cm$^2$) | 5.559 | 5.832 | 5.831 |
| Luminance (cd/m$^2$) | 800 | 800 | 800 |
| Current efficiency (cd/A) | 14.423 | 13.761 | 13.796 |
| Power (lm/W) | 13.227 | 12.670 | 10.513 |

TABLE 1-continued

|  | Example 1 | Example 2 | Comparative Example 1 |
|---|---|---|---|
| X coordinate | 0.682 | 0.684 | 0.681 |
| Y coordinate | 0.317 | 0.314 | 0.318 |

Referring to Table 1, it can be seen that the organic light emitting devices of Examples 1 and 2 have better turn-on voltages, power, and the like, compared to the organic light emitting device of Comparative Example 1. In addition, referring to FIGS. 2 and 4, it can be seen that the organic light emitting devices of Examples 1 and 2 have longer life-times than the organic light emitting device of Comparative Example 1.

EXAMPLE 3

As an anode, a 15 Ω/cm$^2$ (1200 Å) ITO glass substrate was cut to a size of 50 mm×50 mm×0.7 mm, and microwave-washed with isopropyl alcohol and pure water for 5 minutes, respectively. The ITO glass substrate was irradiated with ultraviolet rays for 30 minutes and washed with ozone, and then installed in a vacuum deposition device.

A hole injecting material (Product name: LHT-001 obtained from LUDIS) was vacuum-deposited on the glass substrate to form a hole injection layer having a thickness of 130 nm. Subsequently, a hole transporting material (Product name: IDE-406 obtained from Idemitsu Co.) was vacuum-deposited to form a second auxiliary layer having a thickness of 40 nm. 4,4'-bis[N-(1-naphthyl)-N-phenylamino]biphenyl (NPB) was then vacuum-deposited on the second auxiliary layer to form a hole transport layer having a thickness of 20 nm.

A known green fluorescent host GGH01 obtained from Gracel company and a known green fluorescent dopant GD01 (dopant amount: 15 wt %) were co-deposited on the hole transport layer to form a green fluorescent emissive layer having a thickness of 20 nm.

Subsequently, Alq$_3$ was vacuum-deposited on the emissive layer to form an electron transport layer having a thickness of 30 nm. LiF was then vacuum-deposited on the electron transport layer to form an electron injection layer having a thickness of 0.5 nm, and Mg:Ag was vacuum-deposited to a thickness of 16 nm to manufacture an organic light emitting device.

EXAMPLE 4

An organic light emitting device was manufactured as in Example 3, except that HTM016 obtained from Merck was used instead of IDE406 obtained from Idemitsu Co. as the second auxiliary layer.

EXAMPLE 5

An organic light emitting device was manufactured as in Example 3, except that ELM307 obtained from ELM was used instead of IDE406 obtained from Idemitsu Co. as the second auxiliary layer.

COMPARATIVE EXAMPLE 2

An organic light emitting device was manufactured as in Example 3, except that LHT-001 (used to form the hole injection layer) was used instead of IDE406 obtained from Idemitsu Co. as the second auxiliary layer.

EVALUATION EXAMPLE 2

Figure 6:
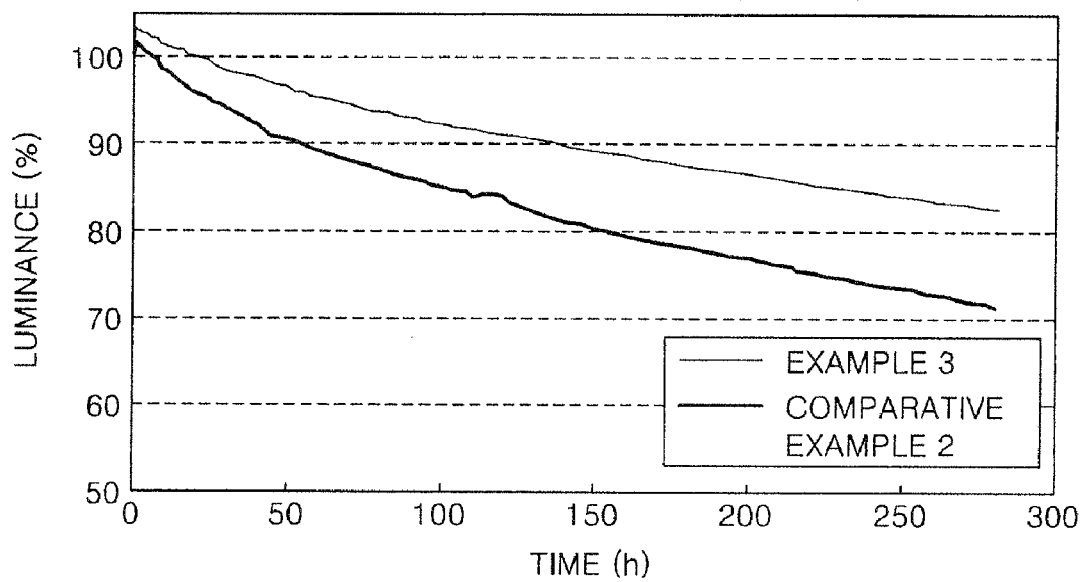
FIG. 6 is a graph comparing the accelerating life-times of the organic light emitting device prepared according to Example 3 and the organic light emitting device prepared according to Comparative Example 2.
Figure 7:
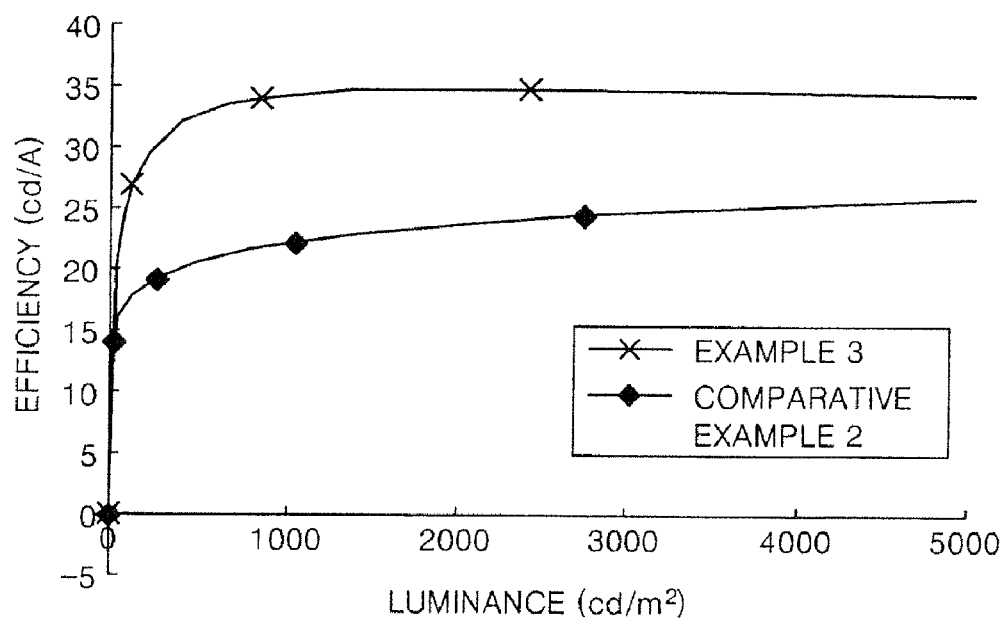
FIG. 7 is a graph comparing the efficiencies of the organic light emitting device prepared according to Example 3 and the organic light emitting device prepared according to Comparative Example 2.
Figure 8:
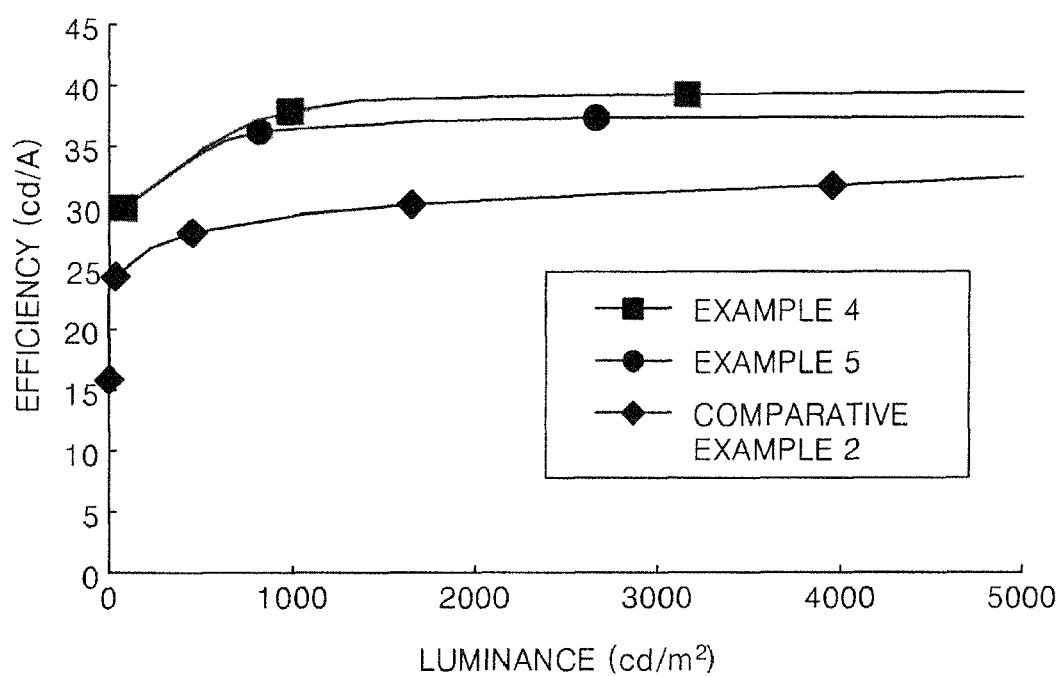
FIG. 8 is a graph comparing the efficiencies of the organic light emitting devices prepared according to Examples 4 and 5, and the organic light emitting device prepared according to Comparative Example 2.

Turn-on voltages, current densities, luminance, current efficiencies, power, and color coordinates of the organic light emitting devices of Examples 3, 4 and 5 and Comparative Example 2 were evaluated using a PR650 Spectroscan spectrometer (from PHOTO RESEARCH INC.). The results are shown in Table 2 below. In addition, accelerating life-time (5 times) data of the organic light emitting devices of Example 3 and Comparative Example 2 are shown in FIG. 6, and current efficiency data thereof are shown in FIG. 7. In addition, current efficiency data of the organic light emitting devices of Examples 4 and 5 and Comparative Example 2 are shown in FIG. 8.

TABLE 2

|  | Example 3 | Example 4 | Example 5 | Comparative Example 2 |
|---|---|---|---|---|
| Turn-on voltage (V) | 3.8 | 3.7 | 3.8 | 4.2 |
| Current density (mA/cm2) | 5.5 | 4.9 | 5.1 | 8.0 |
| Luminance (cd/m2) | 1900 | 1900 | 1900 | 1900 |
| Current efficiency (cd/A) | 34.3 | 38.4 | 36.7 | 23.2 |
| Power (lm/W) | 28.2 | 32.6 | 30.5 | 17.2 |
| X coordinate | 0.213 | 0.234 | 0.214 | 0.216 |
| Y coordinate | 0.731 | 0.721 | 0.730 | 0.730 |

Referring to Table 2, it can be seen that the organic light emitting devices of Examples 3, 4 and 5 have better turn-on voltages, current densities, current efficiencies, power, and the like, compared to the organic light emitting device of Comparative Example 2. In addition, referring to FIG. 6, it can be seen that the organic light emitting device of Example 3 has a longer life-time than the organic light emitting device of Comparative Example 2.

As described above, the organic light emitting devices according to the present invention include at least one auxiliary layer corresponding to a red subpixel and/or a green subpixel for adjusting the resonance cycle of red light and/or green light. The auxiliary layer comprises a material different from the material of the hole injection layer in order to improve efficiency, color purity, and the like of the red light and/or green light, and thereby yield an OLED having high efficiency, low turn-on voltage, high luminance, and long life-time.

While the present invention has been illustrated and described with reference to certain exemplary embodiments, it will be understood by those of ordinary skill in the art that various modifications may be made to the described embodiments without departing from the spirit and scope of the present invention as defined by the following claims.

What is claimed is:

1. An organic light emitting device comprising:
a substrate;
a first electrode;
a second electrode; and
an organic layer between the first electrode and the second electrode, the organic layer comprising a hole injection layer and an emissive layer, the emissive layer comprising a red emissive layer, a green emissive layer, and a blue emissive layer, wherein the organic layer further comprises an auxiliary layer selected from the group consisting of:

a first auxiliary layer between the hole injection layer and only the red emissive layer of the emissive layer for adjusting a resonance cycle of red light,
a second auxiliary layer between the hole injection layer and only the green emissive layer of the emissive layer for adjusting a resonance cycle of green light, and combinations thereof;
the organic light emitting device further comprising a hole transport layer directly contacting the red emissive layer and the green emissive layer, wherein the auxiliary layer comprises a material having a hole mobility of about 1.5 to about 2 times that of 4,4'-bis [N-(1-napthyl)-N-phenylamino]biphenyl (NPB) and is different from a material of the hole injection layer.

2. The organic light emitting device of claim 1, wherein the material of the hole injection layer has a highest occupied molecular orbital (HOMO) energy level of about −4.5 to about −5.5 eV.

3. The organic light emitting device of claim 1, wherein the material of the hole injection layer is selected from the group consisting of phthalocyanine compounds, TCTA, m-MT-DATA, m-MTDAPB, polyaniline/Dodecylbenzenesulfonic acid (PANI/DBSA), poly(3,4-ethylenedioxythiophene)/poly (4-styrenesulfonate) (PEDOT/PSS), polyaniline/camphor sulfonic acid (Pani/CSA), and (polyaniline)/poly(4-styrenesulfonate) (PANI/PSS).

4. The organic light emitting device of claim 1, wherein the hole injection layer has a thickness of about 10 to about 200 nm.

5. The organic light emitting device of claim 1, wherein the auxiliary layer comprises at least a first auxiliary layer, the material of the first auxiliary layer having a HOMO energy level within about ±0.5 eV of a HOMO energy level of the material of the hole injection layer.

6. The organic light emitting device of claim 1, wherein the auxiliary layer comprises at least a first auxiliary layer, the material of the first auxiliary layer having a HOMO energy level within about ±0.3 eV of a HOMO energy level of the material of the hole injection layer.

7. The organic light emitting device of claim 1, wherein the auxiliary layer comprises at least a first auxiliary layer, the first auxiliary layer having a thickness of about 60 to about 100 nm.

8. The organic light emitting device of claim 1, wherein the auxiliary layer comprises at least a second auxiliary layer, the material of the second auxiliary layer having a HOMO energy level within about ±0.5 eV of a HOMO energy level of the material of the hole injection layer.

9. The organic light emitting device of claim 1, wherein the auxiliary layer comprises at least a second auxiliary layer, the material of the second auxiliary layer having a HOMO energy level within about ±0.3 eV of a HOMO energy level of the material of the hole injection layer.

10. The organic light emitting device of claim 1, wherein the auxiliary layer comprises at least a second auxiliary layer, the second auxiliary layer having a thickness of about 20 to about 60 nm.

11. The organic light emitting device of claim 1, wherein the auxiliary layer comprises a first auxiliary layer and a second auxiliary layer, the material of the first auxiliary layer being the same as the material of the second auxiliary layer.

12. The organic light emitting device of claim 1, wherein the material of the auxiliary layer is represented by Formula 1:

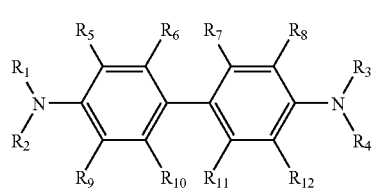

Formula 1 wherein each of $R_1$ through $R_{12}$ is independently selected from the group consisting of hydrogen, hydroxyl groups, cyano groups, substituted and unsubstituted $C_1$-$C_{30}$ alkyl groups, substituted and unsubstituted $C_1$-$C_{30}$ alkoxy groups, substituted and unsubstituted $C_2$-$C_{30}$ alkenyl groups, substituted and unsubstituted $C_2$-$C_{30}$ alkynyl groups, substituted and unsubstituted $C_6$-$C_{30}$ aryl groups, substituted and unsubstituted $C_3$-$C_{30}$ heteroaryl groups, and —$N(A_1)(A_2)$ groups wherein each of $A_1$ and $A_2$ is independently selected from the group consisting of substituted and unsubstituted $C_6$-$C_{30}$ aryl groups, and substituted and unsubstituted $C_3$-$C_{30}$ heteroaryl groups.

13. The organic light emitting device of claim 12, wherein each of $R_1$ through $R_{12}$ is independently selected from the group consisting of hydrogen, phenyl groups, (N,N-diphenyl) aminophenyl groups, naphthyl groups, anthracenyl groups, and N-phenylcarbazolyl groups.

14. The organic light emitting device of claim 1, wherein the auxiliary layer comprises at least a first auxiliary layer, and the hole transport layer is between the red emissive layer and the first auxiliary layer.

15. The organic light emitting device of claim 1, wherein the auxiliary layer comprises at least a second auxiliary layer, and the hole transport layer is between the green emissive layer and the second auxiliary layer.

16. The organic light emitting device of claim 1, further comprising a layer selected from the group consisting of electron blocking layers, hole blocking layers, electron transport layers, electron injection layers, and combinations thereof.

17. The organic light emitting device of claim 1, wherein during operation of the organic light emitting device, a resonance occurs between the first electrode and the second electrode.

\* \* \* \* \*